United States Patent
Lev et al.

(10) Patent No.: US 10,541,104 B2
(45) Date of Patent: Jan. 21, 2020

(54) SYSTEM AND METHOD FOR SCANNING AN OBJECT WITH AN ELECTRON BEAM USING OVERLAPPING SCANS AND ELECTRON BEAM COUNTER-DEFLECTION

(71) Applicant: APPLIED MATERIALS ISRAEL LTD., Rehovot (IL)

(72) Inventors: Uri Lev, Mazkeret Batya (IL); Alon Litman, Ness Ziona (IL); Zvi Nir, Karmei Yosef (IL); Arnon Mizrahy, Rishon Lezion (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 14/795,793

(22) Filed: Jul. 9, 2015

(65) Prior Publication Data

US 2017/0011883 A1 Jan. 12, 2017

(51) Int. Cl.
*H01J 37/28* (2006.01)
*H01J 37/147* (2006.01)

(52) U.S. Cl.
CPC ............ *H01J 37/147* (2013.01); *H01J 37/28* (2013.01); *H01J 2237/004* (2013.01); *H01J 2237/2813* (2013.01); *H01J 2237/31764* (2013.01)

(58) Field of Classification Search
None
See application file for complete search history.

(56) References Cited

U.S. PATENT DOCUMENTS

| 5,502,306 A | 3/1996 | Meisburger et al. |
| 5,869,833 A | 2/1999 | Richardson et al. |

(Continued)

FOREIGN PATENT DOCUMENTS

| JP | H05-258703 A2 | 10/1993 | |
| JP | 2000200579 A | * 7/2000 | ............ H01J 37/026 |

(Continued)

OTHER PUBLICATIONS

U.S. Appl. No. 14/153,923, "Final Office Action", dated Apr. 19, 2016, 8 pages.

(Continued)

*Primary Examiner* — James Choi
(74) *Attorney, Agent, or Firm* — Kilpatrick Townsend & Stockton LLP

(57) ABSTRACT

A method and a charged particle beam system that includes charged particle beam optics and a movable stage; wherein the movable stage is configured to introduce a movement between the object and charged particle beam optics; wherein the movement is of a constant velocity and along a first direction; wherein the charged particle beam optics is configured to scan, by the charged particle beam, multiple areas of the object so that each point of the multiple areas is scanned multiple times; wherein the multiple areas partially overlap; wherein the scanning is executed by the charged particle beam optics; wherein the scanning comprises performing counter-movement deflections of the charged particle beam for at least partially compensating for the movement; and wherein each area of the multiple areas is scanned by following an area scan scheme that defines multiple scan lines that differ from each other.

19 Claims, 10 Drawing Sheets

(56) References Cited

U.S. PATENT DOCUMENTS

| | | | |
|---|---|---|---|
| 6,570,155 B1* | 5/2003 | Prior | B82Y 10/00 250/311 |
| 6,759,655 B2 | 7/2004 | Nara et al. | |
| 7,095,022 B2 | 8/2006 | Nakasuji et al. | |
| 7,253,410 B1 | 8/2007 | Bertsche et al. | |
| 7,253,645 B2 | 8/2007 | Talbot et al. | |
| 7,897,942 B1 | 3/2011 | Bareket et al. | |
| 7,940,384 B2 | 5/2011 | Hill et al. | |
| 7,994,476 B2 | 8/2011 | Bullock et al. | |
| 8,063,363 B2 | 11/2011 | Yeh et al. | |
| 8,378,320 B2* | 2/2013 | Platzgummer | B82Y 10/00 250/492.22 |
| 8,497,475 B2 | 7/2013 | Yeh et al. | |
| 8,884,224 B2 | 11/2014 | Jau et al. | |
| 2005/0279936 A1* | 12/2005 | Litman | G01N 23/225 250/310 |
| 2006/0245636 A1* | 11/2006 | Kitamura | G06K 9/00 382/149 |
| 2008/0122462 A1 | 5/2008 | Nozoe et al. | |
| 2008/0277598 A1 | 11/2008 | Satoh et al. | |
| 2009/0050802 A1 | 2/2009 | Noji et al. | |
| 2009/0134340 A1 | 5/2009 | Furuhashi et al. | |
| 2009/0242761 A1 | 10/2009 | Yeh et al. | |
| 2009/0256075 A1 | 10/2009 | Kemen et al. | |
| 2010/0072365 A1* | 3/2010 | Shoham | G01N 23/2208 250/307 |
| 2012/0305768 A1 | 12/2012 | Yamamoto et al. | |
| 2013/0037716 A1* | 2/2013 | Tadaka | H01J 37/026 250/307 |
| 2013/0306866 A1* | 11/2013 | Hoque | H01J 37/1474 250/310 |
| 2015/0200071 A1 | 7/2015 | Sender et al. | |
| 2015/0311031 A1* | 10/2015 | Platzgummer | H01J 37/147 250/396 R |
| 2016/0322195 A1 | 11/2016 | Sender et al. | |
| 2017/0307539 A1 | 10/2017 | Golberg et al. | |

FOREIGN PATENT DOCUMENTS

| | | |
|---|---|---|
| JP | 2000215834 A | 8/2000 |
| JP | 2004-227886 A | 8/2004 |
| JP | 2009507352 A | 2/2009 |
| JP | 2009-129660 A | 6/2009 |
| JP | 4997076 A | 6/2009 |
| JP | 2017504175 A | 2/2017 |
| KR | 1020080087138 A | 9/2008 |
| KR | 101751663 B1 | 6/2017 |
| TW | 201106411 A | 2/2011 |
| TW | 201237443 A | 9/2012 |
| WO | 2015106212 A1 | 7/2015 |

OTHER PUBLICATIONS

U.S. Appl. No. 14/153,923, "Non-Final Office Action", dated Sep. 2, 2015, 9 pages.
U.S. Appl. No. 14/153,923, "Notice of Allowance", dated Jul. 20, 2016, 5 pages.
KR10-2016-7021872, "Notice of Decision to Grant", dated Mar. 21, 2017, 2 pages.
PCT/US2015/011050, "International Preliminary Report on Patentability", dated Jul. 28, 2016, 9 pages.
PCT/US2015/011050, "International Search Report and Written Opinion", dated Apr. 29, 2015, 12 pages.
TW104101097, "Office Action", dated May 24, 2017, 4 pages.
U.S. Appl. No. 15/207,024, "Notice of Allowance", dated Jul. 14, 2017, 13 pages.
U.S. Appl. No. 15/134,278 Notice of Allowance dated Apr. 23, 2014, 10 pages.
U.S. Appl. No. 15/134,278 Notice of Allowance dated Apr. 23, 2018, 10 pages.
Decision of Patent Examination by Intellectual Property Office Ministry of Economic Affairs for related Taiwanese Patent Application No. 104101097 dated Aug. 15, 2017, 4 pages.

* cited by examiner

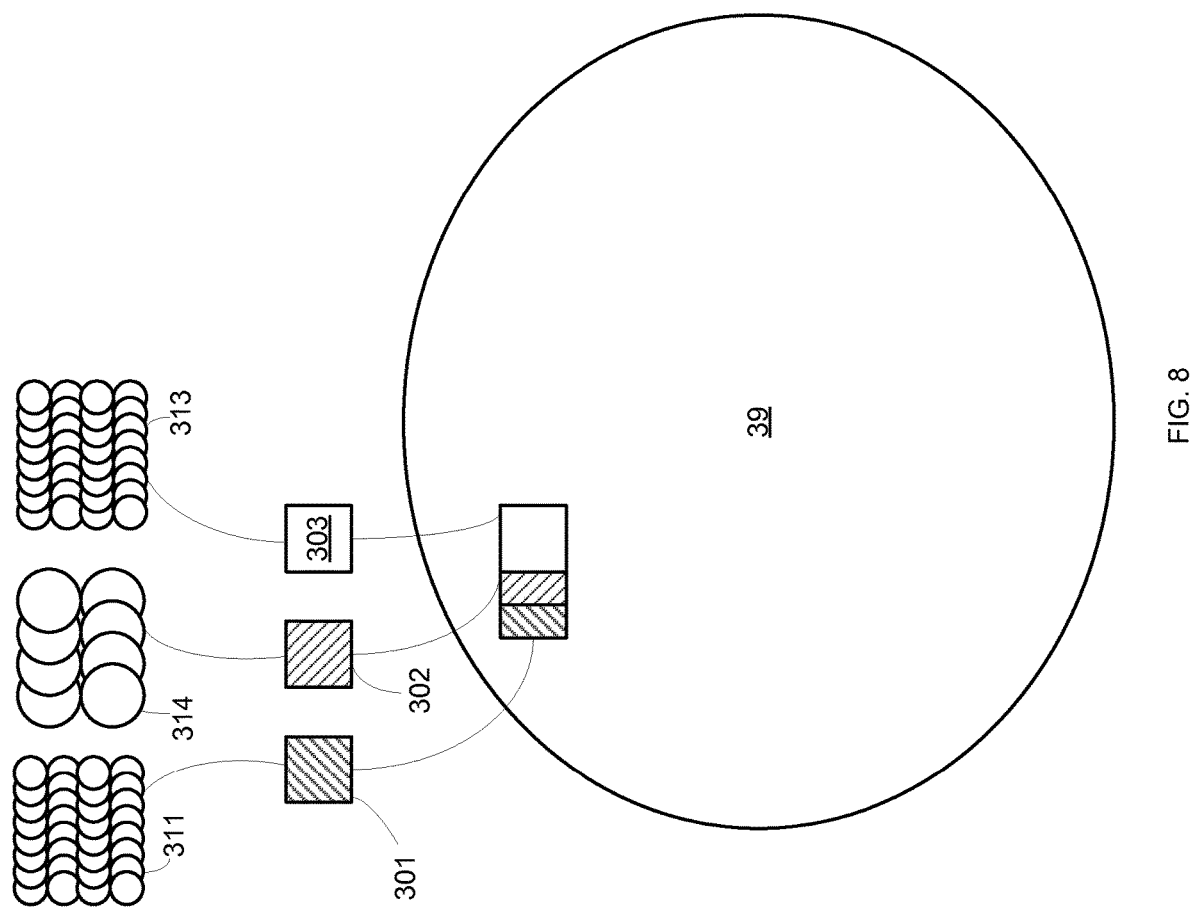

Introducing a movement between the object and charged particle beam optics. The movement is of a constant velocity and along a first direction. 210

Scanning, by the charged particle beam, multiple areas of the object so that each point of the multiple areas is scanned multiple times; wherein the multiple areas partially overlap; wherein the scanning is executed by the charged particle beam optics. The scanning includes performing counter-movement deflections of the charged particle beam for at least partially compensating for the movement. Each area of the multiple areas is scanned by following an area scan scheme that defines multiple scan lines that differ from each other. 220

Generating images of the multiple areas by an imaging module, wherein each area of the multiple areas corresponds to a field of view of the imaging module. The generation of the images includes detecting, by the imaging module, scattered and/or deflected charges particles that are emitted from the wafer during to the scanning. 230

SYSTEM AND METHOD FOR SCANNING AN OBJECT WITH AN ELECTRON BEAM USING OVERLAPPING SCANS AND ELECTRON BEAM COUNTER-DEFLECTION

BACKGROUND OF THE INVENTION

One of the standard methods for imaging a surface, particularly the surface of a semiconductor wafer, is to irradiate the surface with an electron beam in an electron microscope. Secondary electrons from the surface are collected, and may be used to form an image of the irradiated surface. Typically, in order to image the complete surface of the wafer, the electron beam is scanned across the surface, and the surface is moved orthogonally to the direction of the scanned beam.

Electron beam images may exhibit a low signal to noise (SNR) ratio and may suffer from unwanted charging effects.

There is a growing need to reduce charging effects and to increase the signal to noise ratio of electron beam images.

BRIEF SUMMARY OF THE INVENTION

According to an embodiment of the invention there may be provided a charged particle beam system that may include charged particle beam optics; and a movable stage. The movable stage may be configured to introduce a movement between the object and charged particle beam optics; wherein the movement may be of a constant velocity and along a first direction; wherein the charged particle beam optics may be configured to scan, by the charged particle beam, multiple areas of the object so that each point of the multiple areas may be scanned multiple times; wherein the multiple areas partially overlap; wherein the scanning may be executed by the charged particle beam optics; wherein the scanning comprises performing counter-movement deflections of the charged particle beam for at least partially compensating for the movement; and wherein each area of the multiple areas may be scanned by following an area scan scheme that defines multiple scan lines that differ from each other.

A first area scan scheme may differ from a second area scan scheme by at least one charged particle beam parameter; wherein the first area scan scheme may be used for scanning a first area; wherein the second area scan scheme may be used for scanning a second area of the object; and wherein the first area of the object and the second area of the object may belong to the multiple areas.

Adjacent areas of the object may be scanned in an interleaved manner.

According to an embodiment of the invention there may be provided a method for scanning an object with a charged particle beam, the method may include introducing a movement between the object and charged particle beam optics; wherein the movement may be of a constant velocity and along a first direction; and scanning, by the charged particle beam, multiple areas of the object so that each point of the multiple areas may be scanned multiple times; wherein the multiple areas partially overlap; wherein the scanning may be executed by the charged particle beam optics; wherein the scanning comprises performing counter-movement deflections of the charged particle beam for at least partially compensating for the movement; and wherein each area of the multiple areas may be scanned by following an area scan scheme that defines multiple scan lines that differ from each other.

The method may include generating images of the multiple areas by an imaging module, wherein each area of the multiple areas corresponds to a field of view of the imaging module.

A first area scan scheme may differ from a second area scan scheme by at least one charged particle beam parameter; wherein the first area scan scheme may be used for scanning a first area; wherein the second area scan scheme may be used for scanning a second area of the object; and wherein the first area of the object and the second area of the object belong to the multiple areas.

The at least one charged particle beam parameter may be an energy of the charge particle beam.

The at least one charged particle beam parameter may be a width of the charge particle beam.

The at least one charged particle beam parameter may be an intensity of the charge particle beam.

The at least one charged particle beam parameter may be a scan direction of the charge particle beam.

The first area scan scheme may be used for charging the first area of the object; and the second area scan scheme may be used for discharging the second area of the object.

The charged particle beam may be scanned at a scan rate along the multiple scan lines; and wherein a ratio between the scan rate and the constant velocity may differ from a whole number.

The at least one area scan scheme may define multiple scan lines of alternating scan directions.

The adjacent areas of the object may be scanned in an interleaved manner.

A first area scan scheme may differ from a second area scan scheme by at least one charged particle beam parameter; wherein the first area scan scheme may be used for scanning a first area of the object; wherein the second area scan scheme may be used for scanning a second area of the object; and wherein the first area of the object and the second area of the object belong to the multiple areas of the object.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates a wafer, first area, second area, third area, first scan pattern, second scan pattern of lower repetition rate and third scan pattern according to an embodiment of the invention;

FIG. 9 illustrates a method according to an embodiment of the invention; and

Figure 1:
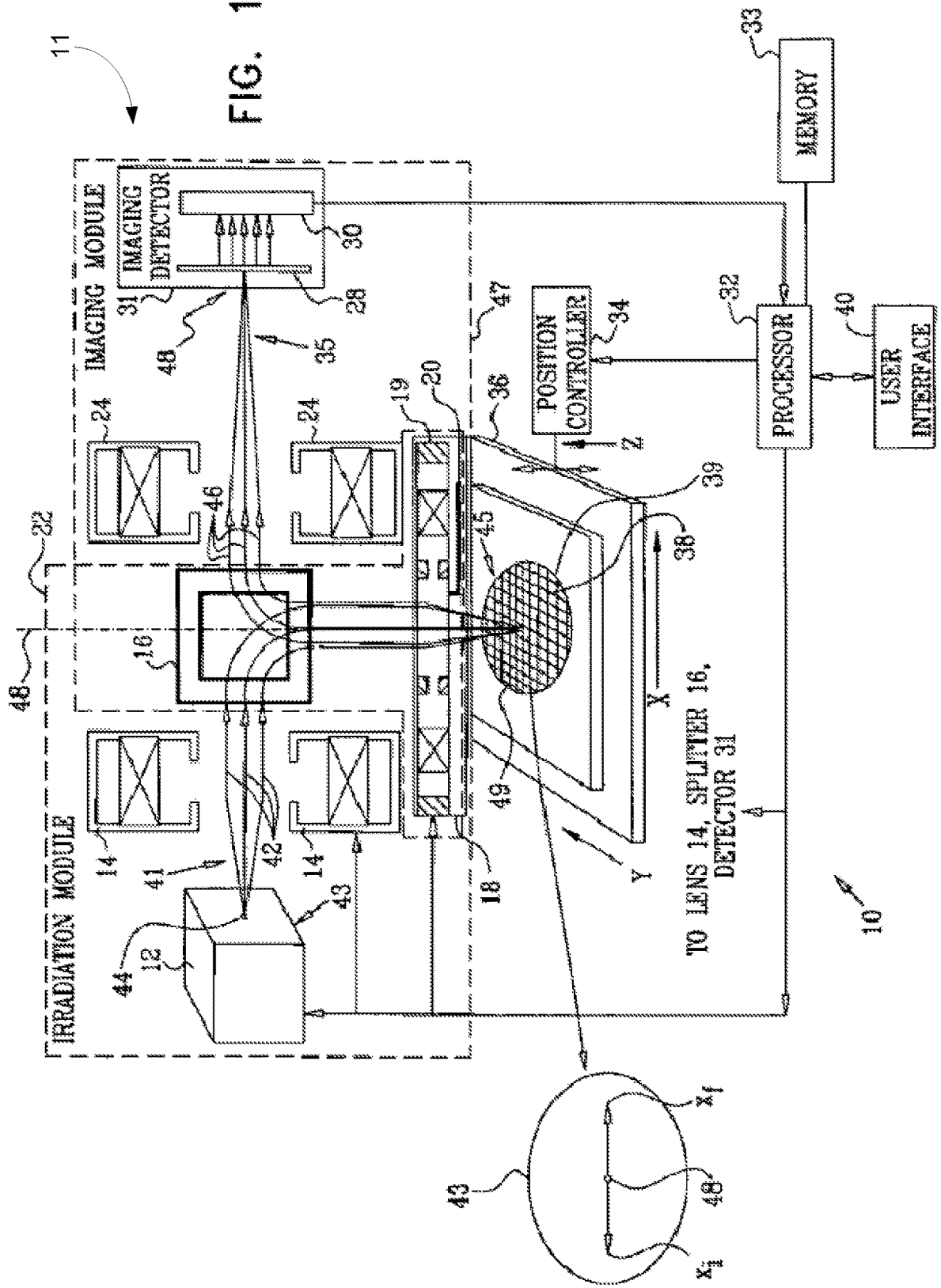
FIG. 1 illustrates a system and a wafer according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 1 illustrates system 10 and wafer 39 according to an embodiment of the invention.

System 10 includes charged particle beam optics. Charged particle beam optics includes charged particle beam irradiation module 22 and imaging module 47.

Charged particle beam irradiation module 22, which, by way of example, is assumed to generate a primary charged particle beam 41 from an aperture 44 of a charged particle gun 12. However, the scope of the present invention is not limited to generation of a single charged particle beam, so that charged particle beam irradiation module 22 may be configured to generate multiple beams.

Furthermore, the scope of the present invention is not limited to focusing a particular type of charged particle, and includes substantially all types of charged particles, including electrons and ions such as Gallium or other metallic ions. By way of example, the description hereinbelow assumes that the primary charged particle beam comprises electrons.

Charged particle beam irradiation module 22 comprises one or more illumination lenses 14, a beam splitter 16, and an objective lens 18, the lenses acting as focusing elements. Typically, the one or more illumination lenses 14 and beam splitter 16 operate magnetically, although the lenses and/or the beam splitter may also incorporate other types of operation, such as electrostatic operation.

Primary charged particle beam 41 follows an irradiation path 42 through charged particle beam irradiation module 22, and along an axis 48, to a surface 38 of a wafer 39, axis 48 typically being orthogonal to the surface.

Wafer 39 is mounted on a movable stage 36, which is assumed to be able to translate the wafer parallel to three orthogonal axes x, y, and z, and the xy plane is assumed to be horizontal. The one or more illumination lenses 14, beam splitter 16, and objective lens 18 focus the primary charged particle beam 41 into a focused image, hereinbelow also referred to as a spot 45, of aperture 44 on surface 38. Wafer 39 comprises a multiplicity of substantially similar dies 49, the dies having substantially congruent layouts. The dies are herein assumed to be rectangular dies having sides parallel to the x and y axes.

Spot 45 generates reflected, secondary, and/or back-scattered electrons as a secondary charged particle beam 35 of electrons, which passes through objective lens 18, and beam splitter 16. The secondary charged particle beam from spot 45 follows an imaging path 46, via an imaging lens 24 to an electron detector 28.

Electron detector 28, typically a phosphor screen comprised of a scintillator crystal or a granulated scintillator powder. Electron detector 28 may convert the secondary charged particle beam 35 of electrons to optical radiation, which is imaged by an imager 30, such as a charge coupled detector (CCD) array.

Electron detector 28 and imager 30 are typically combined as one unit, and act as an imaging detector 31 of the secondary beam, generating a signal indicative of the beam current. Alternatively, imaging detector 31 may comprise an avalanche photodiode array, which directly detects secondary charged particle beam 35 without conversion to light. Objective lens 18, imaging lens 24, beam splitter 16, and imaging detector 31 comprise an imaging module 47 for system 10. The signal generated by imaging module 47 is transferred to a processor 32 coupled to a memory 33. It is noted that imaging detector 31 may include any type of sensor such as but not limited to a PIN diode, a transistors and the like.

Processor 32 is coupled to charged particle gun 12, one or more illumination lenses 14, beam splitter 16, objective lens 18, imaging lens 24, and imaging detector 31, so as to control their operation and the focus of spot 45, and also so as to act as an overall controller of system 10.

Typically, the processor 32 controls a movement of movable stage 36 at a fixed velocity in the y direction and also controls a scanning of primary charged particle beam 41 so that spot 45 scans multiple areas of the object so that each point of the multiple areas is scanned multiple times. The areas are partially overlapping. The partial overlap between the multiple areas results in scanning each point of the multiple areas (except maybe some edge points) multiple times.

The scanning may include performing counter-movement charged particle beam deflections for partially compensating for the movement of the movable stage 36. An upward movement of movable stage 36 along the y direction will necessitate a downwards counter-movement charged particle beam deflection.

The processor 32 may control the scan of each of the multiple areas by following an area scan scheme that defines multiple scan lines that differ from each other. An area scan scheme may define a scan pattern, an intensity of the primary charged particle beam, a shape of the primary charged particle beam, a size of the primary charged particle beam, an energy of the primary charged particle beam, an extraction field applied on wafer 39 or any other property of the scanning of the area.

In order to scan areas without an overlap the processor 32 may reciprocate spot 45 along the x direction. The reciprocation of the spot 45 and the movement along the y direction causes spot 45 to scan wafer in a saw tooth manner.

In order to scan partially overlapping areas the processor 32 further controls the charged particle beam irradiation module 22 to perform counter-movement deflections of the primary charged particle beam on order to at least partially compensate for the movement of the movable stage.

Figure 2:
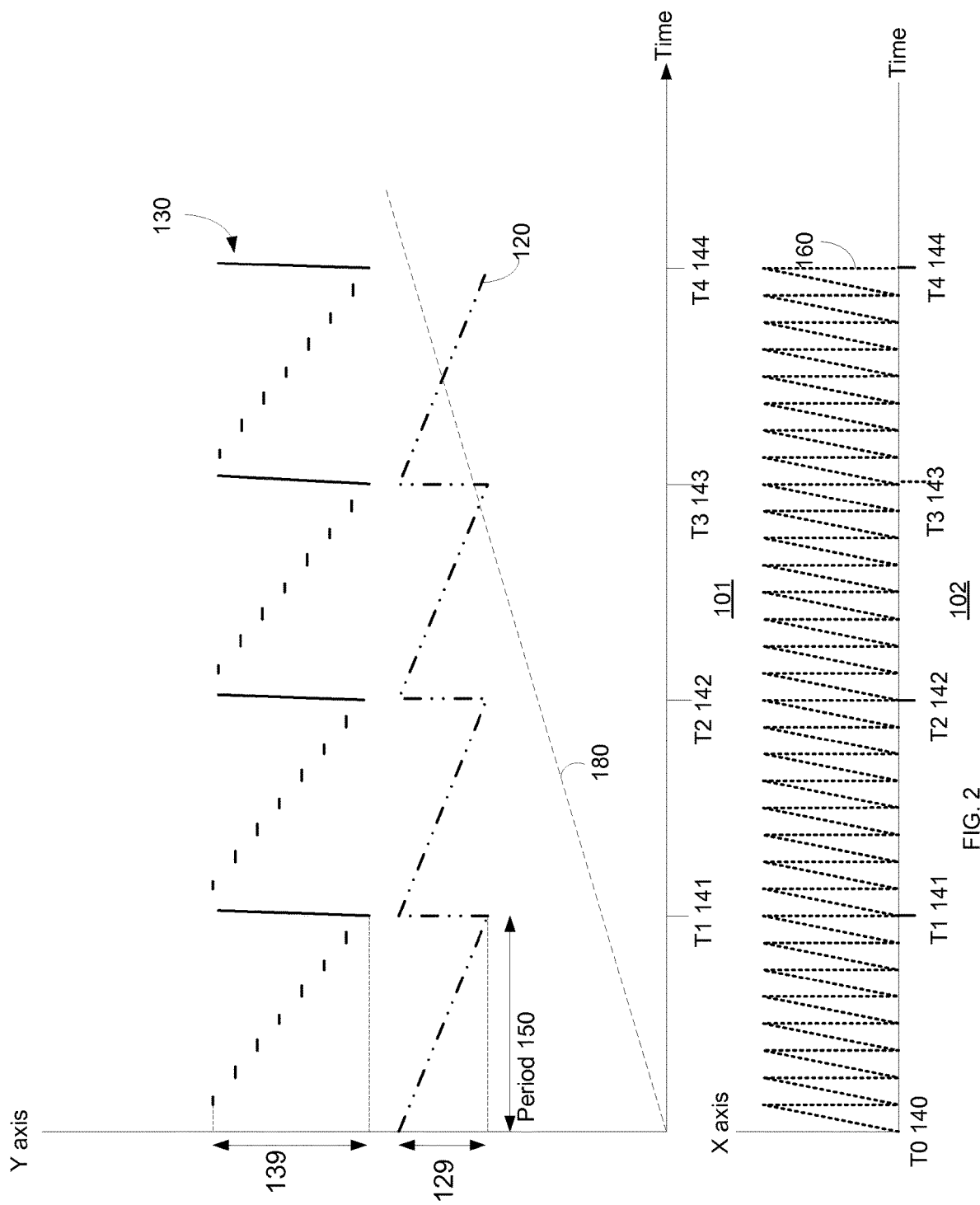
FIG. 2 illustrates a movement of a wafer, y direction deflections, counter-movement deflections and x direction deflections according to an embodiment of the invention.

FIG. 2 illustrates a movement of wafer 39, pattern y direction deflections 130, counter-movement deflections 120 and x direction deflections 160 according to an embodiment of the invention.

FIG. 2 illustrates the scanning of four partially overlapping areas during four periods—a first period between points of time T0 140 and T1 141, a second period between points of time T1 141 and T2 142, a third period between points of time T2 142 and T3 143 and a fourth period between points of time T3 143 and T4 144. The first, second, third and fourth periods have the same duration. The duration is denoted 150.

Graph 101 of FIG. 2 illustrates: (i) the movement of the wafer 39 at a constant velocity along the y direction—as indicated by line 180; (ii) y direction deflections 130 for moving spot 45 from one scan line to the other; and (iii) counter-movement deflections 120 that includes four counter-movement deflections that partially counter the y direction movement of wafer 39 during each one of the first, second, third and fourth periods.

According to another embodiment of the invention the overlaps are caused by introducing differences between the magnitude 139 of the y direction deflections 130 and the magnitude 129 of counter-movement deflections 120. For example, when the slope of line 180 equals the slope of each counter-movement deflection 120 then the overlap ratio is determined by the ratio between the magnitude 139 of the y direction deflections 130 and the magnitude 129 of the counter-movement deflections 120.

Graph 102 of FIG. 2 illustrates x direction deflections 160 scans the spot 45 along the x direction—from left to right—during each scan line.

The combination of the y direction deflections 130 and x direction deflections 160 cause the spot 45 to follow a raster scan pattern per each of the first, second, third and fourth periods—starting from a upper left edge of each area.

Figure 3:
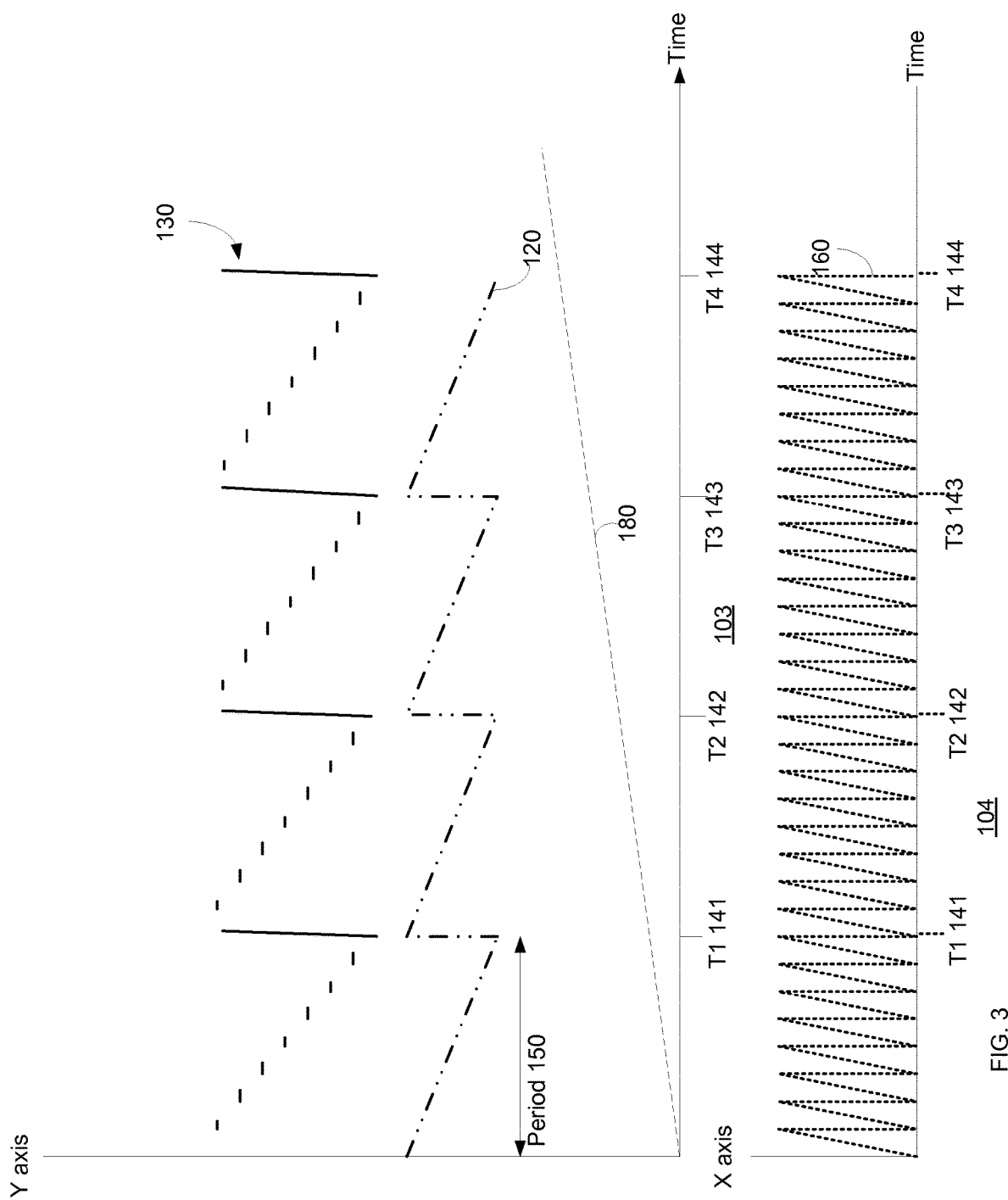
FIG. 3 illustrates a movement of a wafer, y direction deflections, counter-movement deflections and x direction deflections according to an embodiment of the invention.

FIG. 3 illustrates a movement of wafer 39, y direction deflections 130, counter-movement deflections 120 and x direction deflections 160 according to an embodiment of the invention.

FIG. 3 differs from FIG. 2 by moving wafer 39 at a lower velocity—thus having line 180 of a lower slope and having more overlap between adjacent areas of wafer 39.

In addition—the slope of line 180 is lower than the slope of each counter-movement deflection 120—thereby causing overlaps between the four areas of the object that are scanned during the first, second, third and fourth periods. The ratio between the slope of each counter-movement deflection and the slope of line 180 determines the overlap between areas of the object. For example—a slope of each counter-movement deflection that is twice the slope of the line 180 provides an overlap of 50% between adjacent areas.

Figure 4:
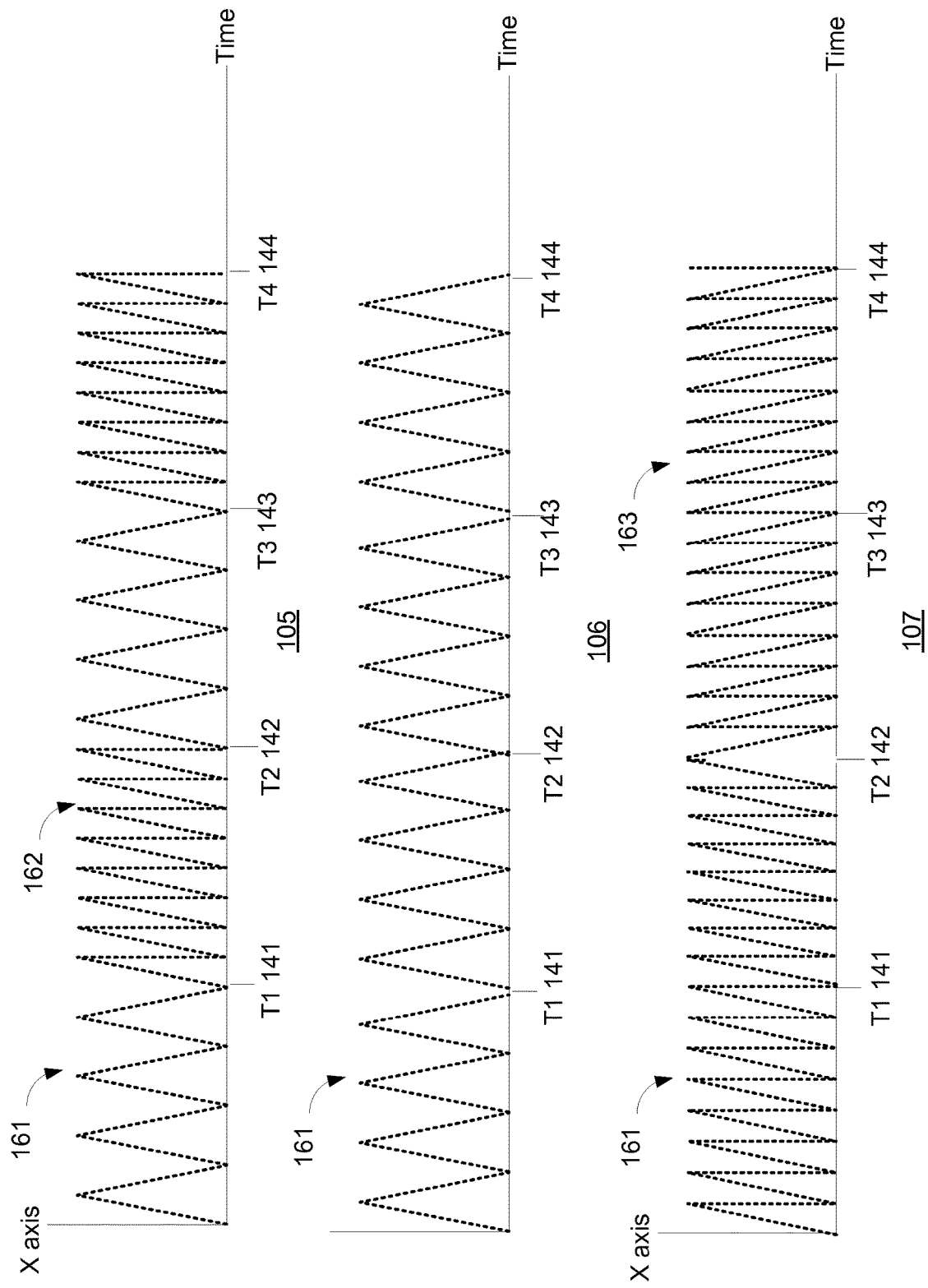
FIG. 4 illustrates x direction deflections according to various embodiments of the invention.
Figure 5:
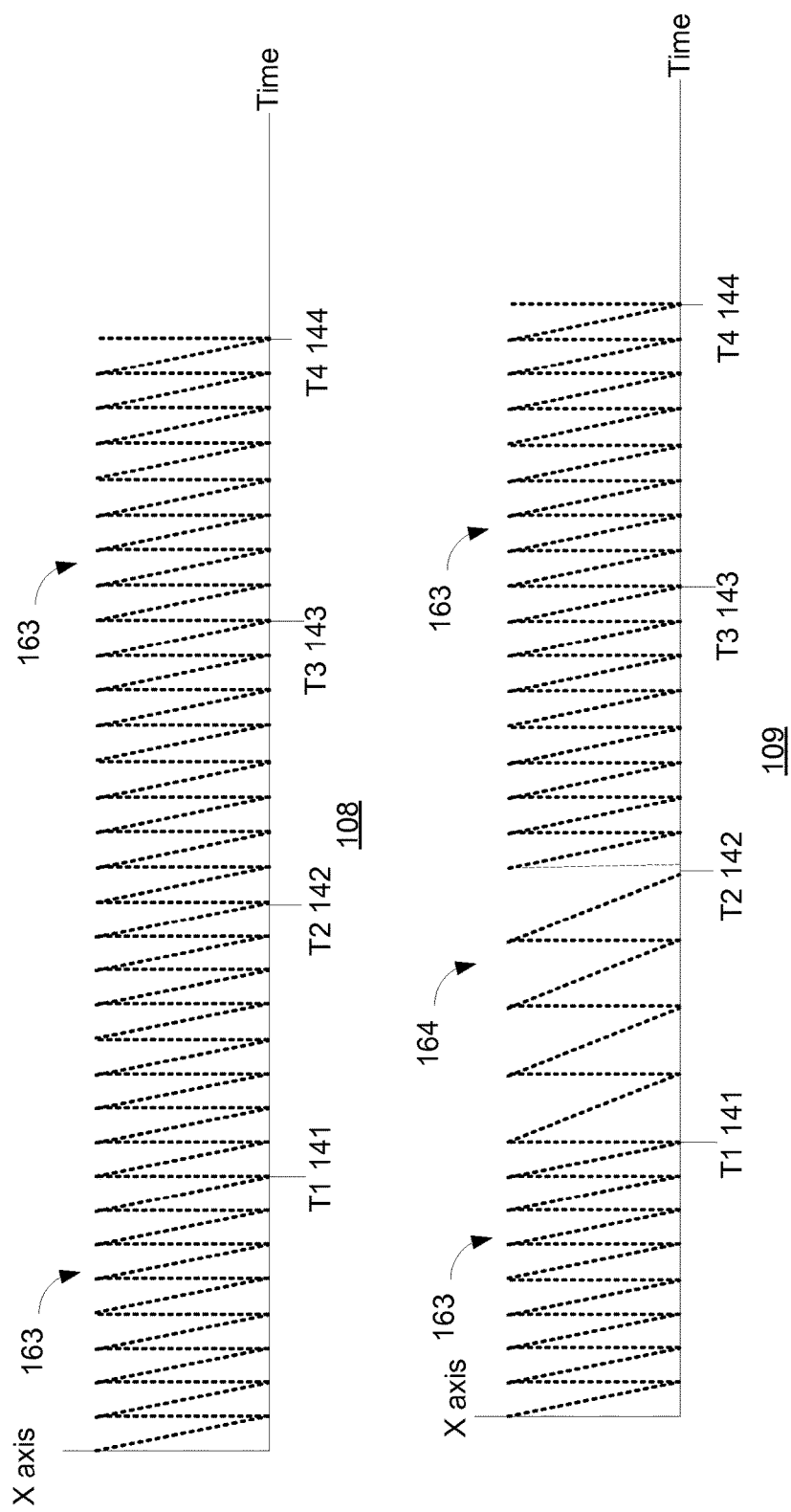
FIG. 5 illustrates x direction deflections according to various embodiments of the invention.

FIG. 4, FIG. 5 and table 1 illustrate x direction deflections according to various embodiments of the invention.

FIG. 4 includes graphs 105, 106 and 107. FIG. 4 includes graphs 108 and 109.

In FIGS. 4 and 5 alternating x direction deflections are denoted 161, left to right x direction deflections are denoted 162, right to left x direction deflections are denoted 163 and x direction deflection of lower repetition rate are denoted 164.

X direction deflection of lower repetition rate 164 have a lower repetition rate than alternating x direction deflections 161, left to right x direction deflections 162 and right to left x direction deflections 163.

For each one of alternating x direction deflections 161 and left to right x direction deflections 162 there may be lower repetition rate equivalent.

The x direction deflection of lower repetition rate 164 may be used for charging an area, for discharging an area, for obtaining a lower resolution image of an area, for interleaving between areas, and the like.

TABLE 1

| Graph | First period | Second period | Third period | Fourth period |
| --- | --- | --- | --- | --- |
| 105 | Alternating x direction deflections 161 | Left to right x direction deflections 162 | Alternating x direction deflections 161 | Left to right x direction deflections 162 |
| 106 | Alternating x direction deflections 161 | Alternating x direction deflections 161 | Alternating x direction deflections 161 | Alternating x direction deflections 161 |
| 107 | Left to right x direction deflections 162 | Left to right x direction deflections 162 | Right to left x direction deflections 163 | Right to left x direction deflections 163 |
| 108 | Right to left x direction deflections 163 | Right to left x direction deflections 163 | Right to left x direction deflections 163 | Right to left x direction deflections 163 |
| 109 | Right to left x direction deflections 163 | X direction deflection of lower repetition rate 164 | Right to left x direction deflections 163 | Right to left x direction deflections 163 |

Figure 6:
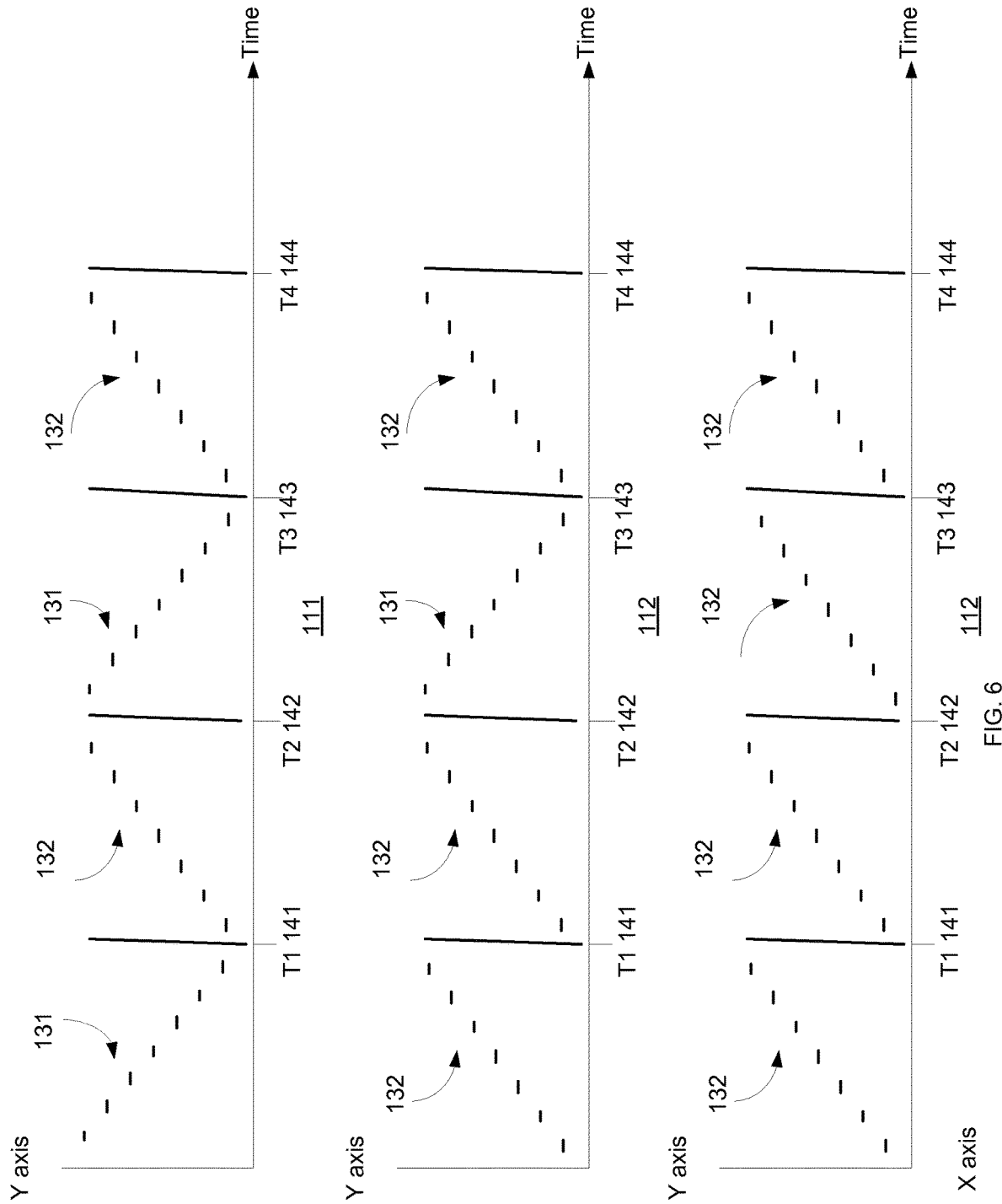
FIG. 6 illustrates y direction deflections according to various embodiments of the invention.

FIG. 6 and table 2 illustrate y direction deflections according to various embodiments of the invention.

FIG. 6 illustrates high to low y direction deflections 131 and low to high y direction deflections 132.

TABLE 2

| Graph | First period | Second period | Third period | Fourth period |
|---|---|---|---|---|
| 111 | Up to low y direction deflections 131 | Low to high y direction deflections 132 | Up to low y direction deflections 131 | Low to high y direction deflections 132 |
| 112 | Low to high y direction deflections 132 | Low to high y direction deflections 132 | Up to low y direction deflections 131 | Low to high y direction deflections 132 |
| 113 | Low to high y direction deflections 132 | Low to high y direction deflections 132 | Low to high y direction deflections 132 | Low to high y direction deflections 132 |

Figure 7:
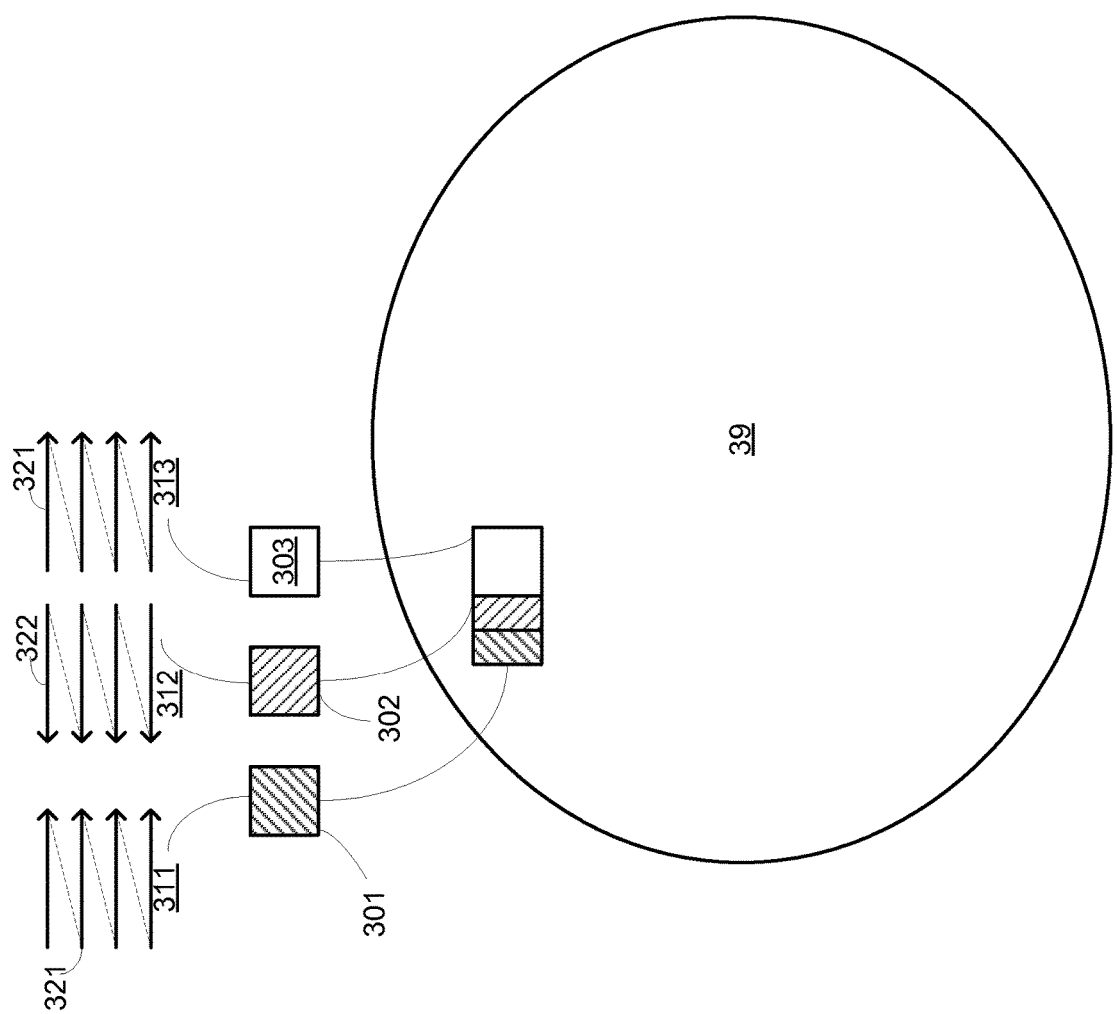
FIG. 7 illustrates a wafer, first area, second area, third area, first scan pattern, second scan pattern and third scan pattern according to an embodiment of the invention.

FIG. 7 illustrates wafer 39, first area 301, second area 302, third area 303, first scan pattern 311, second scan pattern 312 and third scan pattern 313 according to an embodiment of the invention.

There is a fifty percent overlap between second area 302 and each one of first area 301 and third area 303. Each one of the first area 301, second area 302, third area 303 may substantially equal to a field of view of an imaging module.

First scan pattern 311 includes multiple left to right scan lines 321. First area 301 is scanned by spot 45 that follows first scan pattern 311.

Second scan pattern 312 includes multiple right to left scan lines 322. Second area 302 is scanned by spot 45 that follows second scan pattern 312.

Third scan pattern 313 includes multiple left to right scan lines 321. Third area 303 is scanned by spot 45 that follows third scan pattern 313.

FIG. 8 illustrates wafer 39, first area 301, second area 302, third area 303, first scan pattern 311, second scan pattern of lower repetition rate 314 and third scan pattern 313 according to an embodiment of the invention.

The size of spot 45 when performing the first scan pattern 311 and the third scan pattern 313 is smaller than the size of spot 45 when performing the second scan pattern of lower repetition rate 314.

Any combination between any area scan pattern may be provided. Any combination between any x direction deflections and y direction deflections may be provided. A scan pattern may change per each area, per each few areas, and the like.

FIG. 9 illustrates method 200 according to an embodiment of the invention.

Method 200 may start by steps 210 and 220.

Step 210 may include introducing a movement between the object and charged particle beam optics. The movement is of a constant velocity and along a first direction. It is noted that step 210 may include multiple movement iterations and during each movement iteration a constant velocity is maintained.

Step 220 may include scanning, by the charged particle beam, multiple areas of the object so that each point of the multiple areas is scanned multiple times; wherein the multiple areas partially overlap; wherein the scanning is executed by the charged particle beam optics.

Step 220 of scanning includes performing counter-movement deflections of the charged particle beam for at least partially compensating for the movement. Each area of the multiple areas is scanned by following an area scan scheme that defines multiple scan lines that differ from each other.

A first area scan scheme may differ from a second area scan scheme by at least one charged particle beam parameter. A first area scan scheme is used for scanning a first area. A second area scan scheme is used for scanning a second area of the object. See, for example, FIGS. 7 and 8 in which first area 301 is scanned by applying a first scan pattern that differs from the second scan pattern used to scan second area.

The at least one charged particle beam parameter may be an energy of the charged particle beam, an extraction field, a width of the charge particle beam, an intensity of the charge particle beam, a scan direction of the charge particle beam.

Yet for another example—a first area scan scheme may be used for charging the first area of the object. The second area scan scheme may be used for discharging the second area of the object.

The charged particle beam is scanned, during step 220, at a scan rate along the multiple scan lines. A ratio between the scan rate and the constant velocity is not a whole number.

Step 220 may be followed by step 230 of generating images of the multiple areas by an imaging module. Each area of the multiple areas may correspond to a field of view of the imaging module. The generation of the images includes detecting, by the imaging module, scattered and/or deflected charges particles that are emitted from the wafer during to the scanning.

Figure 10:
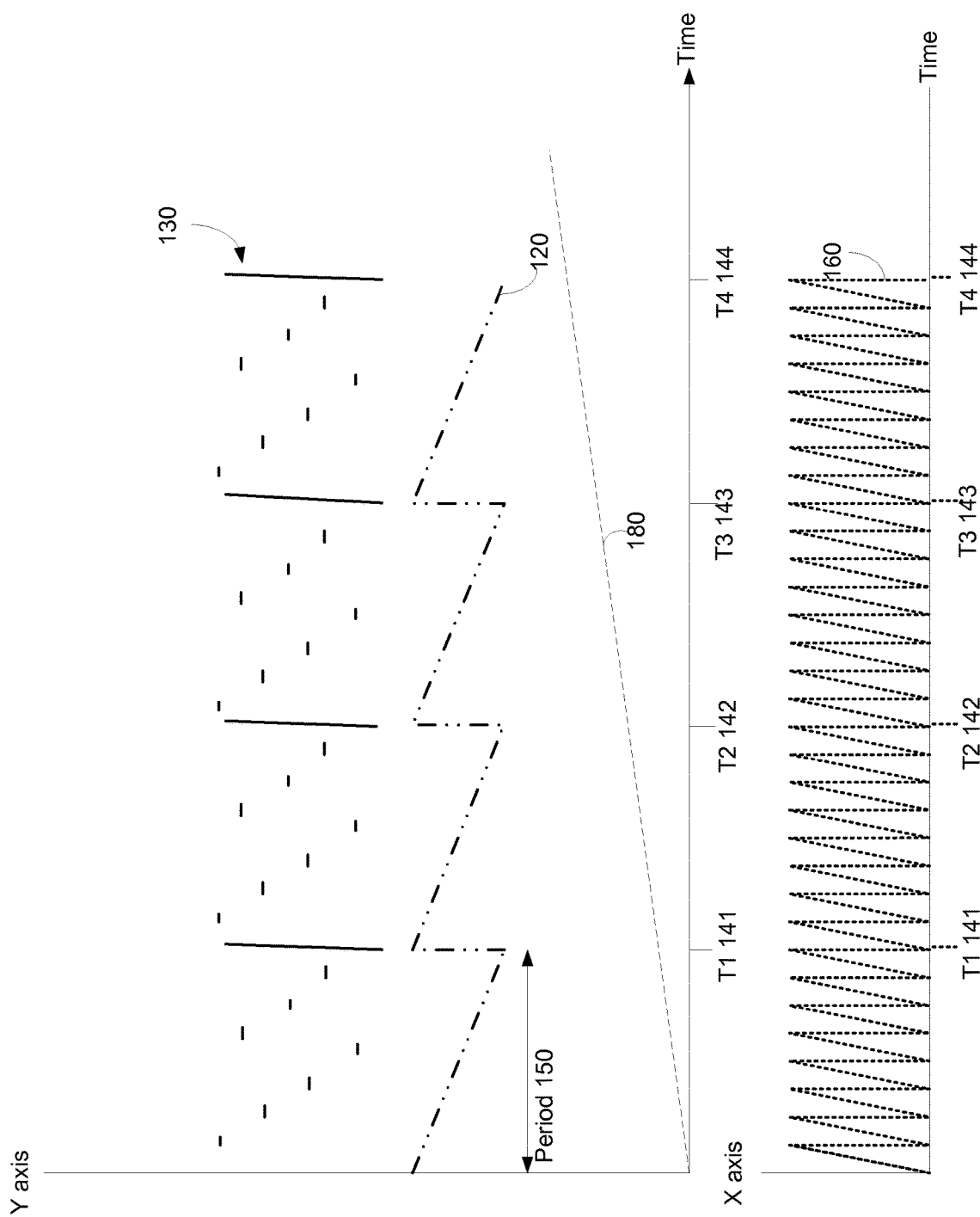
FIG. 10 illustrates a movement of a wafer, raster scan pattern y direction deflections, counter-movement deflections and raster scan pattern x direction deflections according to an embodiment of the invention.

FIG. 10 illustrates a movement of a wafer, y direction deflections 130, counter-movement deflections 120 and x direction deflections 160 according to an embodiment of the invention.

FIG. 10 illustrates an interlaced scheme in which the y direction deflections 130 are not arranged in pure ascending manner or in a pure descending manner. In FIG. 10 the y direction deflections 130 fluctuate to provide an interlacing scanning scheme. It is noted that the number of interlaced frames may differ from two and may be any natural number.

It is further noted that an interlacing scheme may be applied wherein points of the wafer are imaged only once.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A charged particle beam system, comprising:
    charged particle beam optics including a module that generates a charged particle beam, wherein the charged particle beam optics are configured to scan, by the charged particle beam, multiple areas of an object, wherein:
        each area of the multiple areas partially overlaps with at least one adjacent area of the multiple areas so that at least some points of the multiple areas are scanned multiple times,
        each area of the multiple areas is scanned by following an area scan scheme that defines a scan pattern having multiple scan lines, wherein a first area of the multiple areas partially overlaps with a second area of the multiple areas, the scan pattern of the first area is different from the scan pattern of the second area, and the multiple scan lines of the first area are substantially parallel to the multiple scan lines of the second area, and
        each area of the multiple areas corresponds to a different field of view of the charged particle beam optics,
    a movable stage configured to introduce a movement along a first direction at a constant velocity between the object and the charged particle beam optics;
    wherein the scanning is executed by the charged particle beam optics and includes performing counter-movement deflections of the charged particle beam along a second direction substantially opposite the first direction for at least partially compensating for the movement.

2. The charged particle beam system according to claim 1 wherein a first area scan scheme differs from a second area scan scheme by at least one charged particle beam parameter; wherein the first area scan scheme is used for scanning a first area of the object; wherein the second area scan scheme is used for scanning a second area of the object; and wherein the first area of the object and the second area of the object belong to the multiple areas.

3. The charged particle beam system according to claim 1 wherein adjacent areas of the object are scanned in an interleaved manner.

4. A method for scanning an object with a charged particle beam, the method comprising:
introducing a movement of a constant velocity between the object and charged particle beam optics along a first direction; and
scanning, by the charged particle beam, multiple partially overlapping areas of the object so that at least some points of the multiple areas are scanned multiple times and each area of the multiple areas is scanned by following an area scan scheme that defines a scan pattern having multiple scan lines, wherein each area of the multiple areas corresponds to a different field of view of the charged particle beam optics, and a first area scan scheme used for scanning a first area of the multiple areas is different from a second area scan scheme used for scanning a second area of the multiple areas, the scanning including performing counter-movement deflections of the charged particle beam along a second direction substantially opposite the first direction for at least partially compensating for the movement;
wherein the scanning is executed by the charged particle beam optics;
wherein the first area partially overlaps with the second area, the scan pattern of the first area is different from the scan pattern of the second area, and the multiple scan lines of the first area are substantially parallel to the multiple scan lines of the second area;
wherein the first area scan scheme is used for charging the first area; and
wherein the second area scan scheme is used for discharging the second area.

5. The method according to claim 4 further comprising generating images of the multiple areas by an imaging module.

6. The method according to claim 4 wherein the first area scan scheme differs from the second area scan scheme by at least one charged particle beam parameter; and
wherein the first area and the second area belong to the multiple areas.

7. The method according to claim 6 wherein the at least one charged particle beam parameter is an energy of the charge particle beam.

8. The method according to claim 6 wherein the at least one charged particle beam parameter is a width of the charge particle beam.

9. The method according to claim 6 wherein the at least one charged particle beam parameter is an intensity of the charge particle beam.

10. The method according to claim 6 wherein the at least one charged particle beam parameter is a scan direction of the charge particle beam.

11. The method according to claim 4 wherein the charged particle beam is scanned at a scan rate along the multiple scan lines; and wherein a ratio between the scan rate and the constant velocity is not a whole number.

12. The method according to claim 4 wherein at least one area scan scheme defines multiple scan lines of alternating scan directions.

13. The method according to claim 4 wherein adjacent areas of the object are scanned in an interleaved manner.

14. The method according to claim 13 wherein the first area scan scheme differs from the second area scan scheme by at least one charged particle beam parameter; and wherein the first area of the object and the second area of the object belong to the multiple areas of the object.

15. A method for scanning an object with a charged particle beam, the method comprising:
introducing a movement of a constant velocity between the object and charged particle beam optics along a first direction; and
scanning, by the charged particle beam, multiple areas of the object, wherein:
each area of the multiple areas partially overlaps with at least one adjacent area of the multiple areas so that at least some points of the multiple areas are scanned multiple times,
each area of the multiple areas is scanned by following an area scan scheme that defines a scan pattern having multiple scan lines, wherein a first area of the multiple areas partially overlaps with a second area of the multiple areas, the scan pattern of the first area is different from the scan pattern of the second area, and the multiple scan lines of the first area are substantially parallel to the multiple scan lines of the second area, and
each area of the multiple areas corresponds to a different field of view of the charged particle beam optics,
wherein the scanning includes performing counter-movement deflections of the charged particle beam along a second direction substantially opposite the first direction for at least partially compensating for the movement;
wherein the scanning is executed by the charged particle beam optics.

16. The method according to claim 15 wherein a first area scan scheme differs from a second area scan scheme by at least one charged particle beam parameter; wherein the first area scan scheme is used for scanning a first area of the object;
wherein the second area scan scheme is used for scanning a second area of the object; and
wherein the first area of the object and the second area of the object belong to the multiple areas.

17. The method according to claim 15 wherein adjacent areas of the object are scanned in an interleaved manner.

18. The method according to claim 15 further comprising generating images of the multiple areas by an imaging module.

19. The method according to claim 15 wherein the charged particle beam is scanned at a scan rate along the multiple scan lines; and wherein a ratio between the scan rate and the constant velocity is not a whole number.

* * * * *